United States Patent [19]

Haeussler et al.

[11] Patent Number: 4,799,234

[45] Date of Patent: Jan. 17, 1989

[54] LASER TRANSMITTER INCLUDING AN EXTERNAL OPTICAL RESONATOR

[75] Inventors: Klaus M. Haeussler, Munich; Julius Wittmann, Oberhaching; Gisela Gaukel, Munich; Franz Auracher, Baierbrunn, all of Fed. Rep. of Germany

[73] Assignee: Siemens Aktiengesellschaft, Berlin and Munich, Fed. Rep. of Germany

[21] Appl. No.: 95,886

[22] Filed: Sep. 14, 1987

[30] Foreign Application Priority Data

Sep. 29, 1986 [DE] Fed. Rep. of Germany ....... 3633077

[51] Int. Cl.$^4$ .................. H01S 3/082; G02B 6/22; G02B 6/26
[52] U.S. Cl. .................................. 372/97; 372/6; 372/108; 350/96.15; 350/96.17; 350/96.33
[58] Field of Search ............................ 372/97, 108, 6; 350/96.33, 96.15, 96.17

[56] References Cited

U.S. PATENT DOCUMENTS

| | | | |
|---|---|---|---|
| 4,363,533 | 12/1982 | Stowe et al. | 350/96.33 |
| 4,372,643 | 2/1983 | Black | 350/96.33 |
| 4,505,539 | 3/1985 | Auracher et al. | 350/96.15 |

OTHER PUBLICATIONS

Matthews et al., "Packaged Frequency-Stable Tunable 20KHz Linewidth 1.5 μm InGaAsP External Cavity Laser", Electronics Letters, Jan. 31, 1985, vol. 21, No. 3, pp. 113-115.
IEEE Journal of Quantum Electronics, vol. QE-20, No. 5, May 1984, J. Barry, "Design and System Requirements Imposed by the Selection of GaAs/GaAlAs Single Mode Laser Diode for Free Space Optical Communication," pp. 478-490.
IEEE Journal of Quantum Electronics, vol. QE-1, No. 8, Nov. 1965, Smith, "Stabilized, Single-Frequency Output from a Long Laser Cavity", pp. 343-348.
IEEE Journal of Quantus Electronics, vol. QE-18, No. 2, Feb. 1982, Henry "Theory of the Linewidth of Semiconductor Lasers", pp. 259-264.
Electronics Letters, Feb. 3, 1983, vol. 19, No. 3, Henry, "Theory of the Linewidth of Semiconductor Lasers", pp. 259-264.
IEEE Journal of Quantum Electronics, vol. QE-18, No. 10, Oct. 1982, "Relationship Between Carrier-Induced Index Change and Feedback, Noise in Diode Lasers", D. Frye, pp. 1675-1677.
Electronic Letters, Jul. 1985, vol. 21, No. 15, Wyatt, "Analysis of Open Systems Interconnection Transport Protocol Standard", pp. 659-658.
Electronic Letters, Nov. 1983, vol. 19, No. 24, Patzak et al., "Semiconductor Laser Linewidth in Optical Feedback Configuration", pp. 1626-1627.
IEEE Journal of Quantum Electronics, vol. QE-20, No. 4, Apr. 1984, Spano et al., Theory of Noisim Semiconductor Laser in the Presence of Optical Feedback, pp. 350-356.
IEEE Journal of Quantum Electronics, vol. QE-16, No. 1, Jan. 1980, Kobayashi et al., "Microoptic Grating Multiplexers and Optical Isolators for Fiber-Optic Communications", pp. 11-72.

*Primary Examiner*—William L. Sikes
*Assistant Examiner*—Georgia Y. Epps
*Attorney, Agent, or Firm*—Hill, Van Santen, Steadman & Simpson

[57] ABSTRACT

A narrow-band laser transmitter including a semiconductor laser and an external optical resonator in the form of a wavelength-selective fiber directional coupler. A partially reflecting feedback device is provided so that output power of the transmitter can be taken from the resonator. The frequency selective fiber directional coupler is formed by a dispersive double core fiber and the feedback device is supplied with radiant laser energy that is coupled over from one core into the other core and that portion of the radiant energy which has been coupled over is allowed to pass as output power of the transmitter by the feedback device.

5 Claims, 2 Drawing Sheets

LASER TRANSMITTER INCLUDING AN EXTERNAL OPTICAL RESONATOR

BACKGROUND OF THE INVENTION

1. Field of the Invention

The present invention relates generally to a laser transmitter including a semiconductor laser and an external optical resonator formed by a frequency-selective fiber directional coupler.

2. Description of the Related Art

A laser transmitter is disclosed in German Patent Application No. P 36 00 726.9, and in particular in FIG. 2 of the German application and the appertaining descriptive passages. In the disclosed laser transmitter, radiant laser energy is coupled into one waveguide from a semiconductor laser and is supplied to a partially reflecting feedback device. That part of the radiant laser energy transmitted by the feedback device is supplied to a second optical waveguide through a loop-shaped optical waveguide. The output power of the transmitter is taken at the output of the second optical waveguide. The German Patent Application corresponds in part to U.S. pending application Ser. No. 906,503, filed Sept. 12, 1986.

An extremely narrow-band, single-mode operation is achieved with the disclosed laser transmitter, such operation being required for fiber optic communication systems, and in particular for those systems having heterodyne and homodyne reception.

The disclosed laser transmitter has an advantage in that coupling of a resonator and of the fiber system to the semiconductor laser is required at only one side of the semiconductor laser, in contrast to other embodiments f laser transmitters which have a fiber system connected to one side and a resonator coupled to an opposite side of the semiconductor laser. Adjustment problems in the disclosed laser transmitter are considerably alleviated due to the single-sided coupling. It is also easier to provide high mechanical stability in the coupling of the fiber system and of the external resonator.

Dispersive double-core fibers are disclosed in German Published Application No. 34 35 172.

In IEEE Journal of Quantum Electronics, QE-20(1984), pages 486 and following, is disclosed that the line width of a single mode spectrum is inversely proportional to the length of an external resonator.

SUMMARY OF THE INVENTION

An object of the present invention is to provide an extremely compact, narrow-band transmitter for a semiconductor laser, having single-sided coupling without requiring a loop-shaped optical waveguide.

This and other objectives of the invention are achieved in a laser transmitter having an external optical resonator of dispersive double-core fiber, as a feedback device. A coupling length between the two cores of the double-core fiber provides coupling of power between the first and second cores, while the feedback device is supplied with the radiant laser energy that has been coupled over from the first core to the second core. In one embodiment, the double-core fiber is a dispersive double-core fiber as disclosed in the above-identified German Published Application No. 34 35 172, the fiber acting as a highly dispersive resonator.

It is to be particularly emphasized in a resonator of this type that both the resonator and its dispersive properties are insensitive to thermal and mechanical influences, the resonator properties and the dispersive properties thereof being defined by the structural parameters of the double-core fiber, as well as by the simple coupling of the apparatus to a connecting fiber system.

In preferred developments of the present invention, the coupling length between the two fibers is long enough so that radiant laser energy from the first fiber couples over to the second fiber and then back again. In this development, the feedback device is at the opposite end of the double-core fiber from the semiconductor laser, and an optical sump is included for interrupting the first fiber and absorbing energy transmitted therealong. The two fibers of the double-core fiber are preferrably coaxially arranged.

DESCRIPTION OF THE PREFERRED EMBODIMENTS

Figure 1:
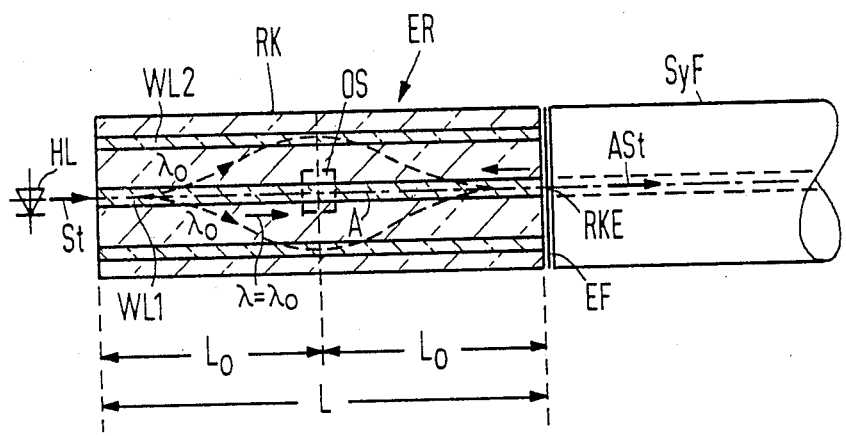
FIG. 1 shows a longitudinal cross section of an exemplary laser transmitter formed of a coaxial lightguide fiber connected to a fiber system.

In FIG. 1 is shown a laser transmitter LS, including a wavelength-selective fiber directional coupler RK provided as an external resonator ER. The directional coupler RK is formed of a dispersive double-core fiber having a rotationally-symmetrical format. In other words, an outer one WL2 of the fiber cores is coaxial with an inner one WL1 of the fiber cores. The fiber core, or optical waveguide, WL1, which in the illustrated embodiment is the central fiber core extending along an axis A of the fiber, is coupled to a semiconductor laser HL. The second fiber core, or optical waveguide, WL2 surrounds the central waveguide WL1 and is spaced at a distance therefrom.

Fundamentally, however, any double core fiber is suited for use in the present invention, including the double-core fibers disclosed in German Published Application No. 34 35 172.

The double-core fiber has a length corresponding to a coupling length L of the fiber directional coupler RK which is an integral multiple of a crossover length $L_O$, and in the illustrated embodiment, the coupling length L is double the crossover length $L_O$. The crossover length $L_O$ is defined herein as that length over which radiant laser energy ST which has been coupled into one of the two waveguides WL1 or WL2 at one end of the double-core fiber is coupled over into the other one of the waveguides WL2 or WL1, respectively. Accordingly, radiant energy ST coupled into the first waveguide WL1 at one end of the double-core fiber completely crosses over into the other waveguide WL2 by the longitudinal midpoint of the double-core fiber. The radiant energy ST again completely crosses over so that it is in the first waveguide WL1 at the second, opposite end of the fiber.

Only the radiant energy having a desired wavelength $\lambda_O$ is coupled over between the waveguides WL1 and WL2. Any radiant energy having a wavelength $\lambda$ differing from the desired wave length $\lambda_O$ is conducted along the first waveguide WL1 without crossing over. In other words, there is frequency selective coupling between the waveguides WL1 and WL2. After traversing the double-core fiber from the one end to the longitudinal midpoint along the single crossover distance $L_O$, all the radiant energy ST of wavelength $\lambda_O$ has completely coupled from the first waveguide WL1 into the second waveguide WL2. The first waveguide WL1 is interrupted, such as by an optical sump or light absorber OS. Thus, any radiant laser energy having a wavelength differing from the desired wavelength $\lambda_O$ cannot proceed to a second end EF of the double-core fiber which faces away from the semiconductor laser HL, so that essentially only radiant laser energy having th wavelength $\lambda_O$ can reach the end EF.

In the embodiment of FIG. 1, the optical absorber or sump OS is formed by covering an end facet of the inner waveguide WG1 by a layer of material that strongly absorbs light of the desired wavelength. In one example, the wavelength absorbing material is polycrystalline silicon sputtered or evaporated onto the fiber end in the area of the inner waveguide WG1. To apply the absorbing material, the coaxial fiber is first severed transversely, such as at the midpoint, and then after the optical sump OS is applied, the severed fiber is rejoined.

Figure 2:
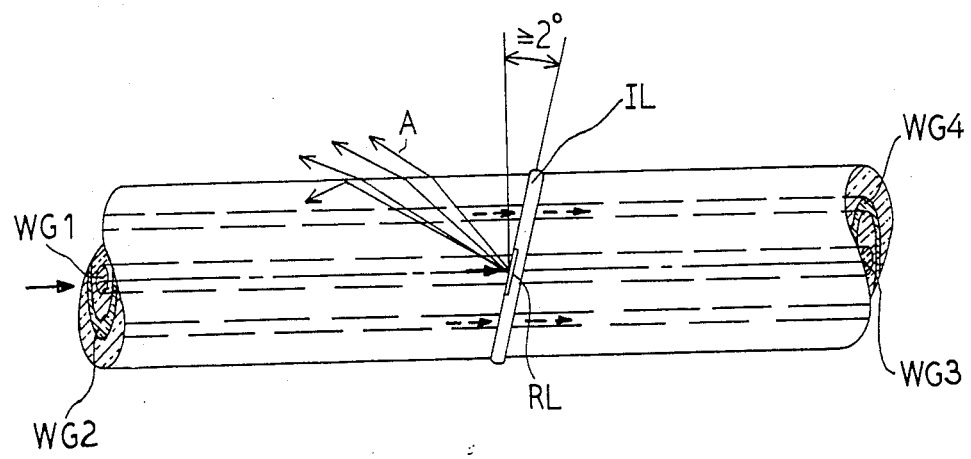
FIG. 2 is a side elevational view of a coaxial resonator of the laser transmitter of FIG. 1 showing one embodiment of an optical sump.
Figure 3:
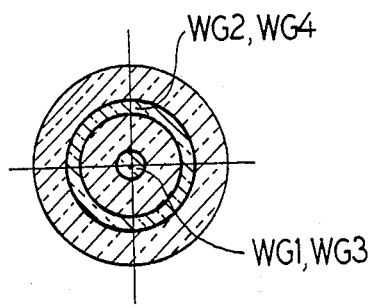
FIG. 3 is an end elevational view of the coaxial resonator of FIG. 2.

In another example, which is shown in FIGS. 2 and 3, the coaxial fiber is divided transversely to form two fiber portions of approximately equal length. The first fiber portion has a central waveguide WG1 and an outer waveguide WG2, while the second fiber portion has an inner waveguide WG3 and an outer waveguide WG4. The end of the first fiber portion is simply polished at a slight angle of, for example 2° to 15° relative to the normal of the fiber axis. A reflective layer RL is evaported onto the polished surface in the area of the inner waveguide WG1. Examples of reflective layers include gold, aluminum, or a suitable arrangement of dielectric layers. The light in the inner waveguide WG1 is reflected out of the waveguide WG1 as shown at A and does not return to the laser. Thus, the term optical absorber or sump as used herein also includes reflective surfaces and the like.

To obtain good transmission of light from the outer waveguide WG2 of the first portion to the outer waveguide WG4 of the second portion when the fiber is divided as shown, both facing end faces of the fiber portions are polished parallel to one another. In addition, it is preferable to fill the gap formed therebetween with an immersion liquid IL or a glue, such as epoxy, having a refractive index close to that of the waveguides WG2 and WG4.

Referring again to FIG. 1, a partially reflecting feedback device RKE is provided at the end EF of the double-core fiber at least in the region of the first waveguide WL1. The partially reflecting feedback device RKE is, in one example, a partially transmitting mirror layer.

That portion of the radiant energy ST having the desired wavelength $\lambda_O$, and which has passed through the feedback device RKE, is coupled into a core of a system fiber SYF that, for example, is butt-coupled to the double-core fiber. Thus, the radiant energy of wavelength $\lambda_O$ is conducted through the system fiber SYF.

When a double-core fiber having only a single crossover length $L_O$, or even having an uneven multiple of crossover lengths $L_O$, is used, the feedback device RKE is provided at the end EF of the double-core fiber facing away from the semiconductor laser HL at least in the region of the waveguide WL2 to which the laser HL is not attached. Thus, the feedback device RKE is provided at the end of the waveguide which carries the desired wavelength energy, this being determined by whether an even or an odd multiple of crossover lengths $L_O$ are provided. The fiber system SYF in the odd multiple crossover length embodiment is likewise coupled to the waveguide WLZ. An optical sump, or absorber, is generally not required here, but can be provided, for example, for the waveguide WL1 coupled to the laser HL at the end which faces away from the semiconductor laser HL.

Generally, the crossover length $L_O$, the wavelength $\lambda_O$ of the reflected radiation, the bandwidth and, thus, the selectivity of the resonator are determined only by the structural parameters of the double core fiber.

Due to the feedback of a portion of the power admitted to the external resonator ER the semiconductor laser HL, single-mode operation having a narrow line width of the laser transmitter is forced. Since the line width of the resulting single-mode spectrum is inversely proportional to the length of the external resonator, a double core fiber having a length amounting to a multiple crossover lengths $L_O$ can be used to achieve narrower line widths.

It is expedient to apply a highly reflective coating to that side of the semiconductor laser body HL that faces away from the external resonator ER. a result, the optical power for a given pump system is increased due to the lowering of the threshold current, and the sensitivity with respect to parasitic reflections is lowered as well. This applies to all laser transmitters having external resonators and single sided coupling, such as where the output power of the transmitter is taken at the side of the resonator.

Although other modifications and changes may be suggested by those skilled in the art, it is the intention of the inventors to embody within the patent warranted hereon all changes and modifications as reasonably and properly come within the scope of their contribution to the art.

We claim:

1. A laser transmitter, comprising:
   a semiconductor laser;
   an external optical resonator in the form of a wavelength-selective fiber directional coupler, said wavelength selective fiber directional coupler being composed of a dispersive double core fiber,
   a first core of said double core fiber being a first waveguide coupled to said semiconductor laser to receive radiant laser energy,
   a second core of said double core fiber being a second waveguide having a defined coupling length relative to said first waveguide for coupling power between said first and second waveguides, said defined coupling length being of a size to provide that the radiant energy coupled over from said first waveguide to said second waveguide again couples over into said first waveguide at an end of said double core fiber opposite said semiconductor laser, said dispersive double core fiber providing complete crossover of laser energy from said first waveguide onto said second waveguide and complete crossover of the laser energy from said second waveguide to said first waveguide at an end of said double core fiber opposite said semiconductor laser, said laser energy being a desired wavelength for emission from said resonator;

a feedback device being supplied with a radiant laser energy that is coupled over from said first waveguide into said second waveguide over a coupling length, said feedback device enabling a portion of said coupled-over radiant energy to pass from said laser transmitter as output power, said feedback device being provided at least in an area of said first waveguide at said semiconductor laser; and an optical absorber or sum interrupting said first waveguide and disposed inside said double core fiber.

2. A laser transmitter as claimed in claim 1, wherein said first and second optical waveguides are coaxial,
   said laser being coupled to an inner one of said coaxial optical waveguides, and
   said optical sump being provided for said inner optical waveguide.

3. A laser transmitter as claimed in claim 1, wherein said optical sump is a reflective layer at an acute angle relative to a normal of the waveguide axis.

4. A laser transmitter as claimed in claim 1, wherein said optical sump is a layer of wavelength absorbing material applied to an end facet of said one of said waveguide.

5. A laser transmitter as claimed in claim 1, wherein said double core fiber is divided transversely into two parts to form mutually abutting faces at an angle to an axis of said fiber of between 88 degrees and 75 degrees, said two parts of said fiber being substantially equal in length, and further comprising:
   a reflective layer applied to least one of said mutually abutting faces of said two parts over at least said inner fiber core;
   an immersion liquid having our index of refraction substantially similar to an index of refraction of said outer fiber core and disposed between said mutually abutting faces of said two parts at least in an area of said outer fiber core; and
   a partially transmissive mirror layer applied between said two parts to one of said mutually abutting faces in an area of said first fiber core.

\* \* \* \* \*